(12) United States Patent
Johnson, Jr. et al.

(10) Patent No.: US 8,981,204 B2
(45) Date of Patent: Mar. 17, 2015

(54) INTEGRATED SHIPPING AND INSTALLATION RACKING

(75) Inventors: Richard L. Johnson, Jr., Suffolk, VA (US); Richard J. Russell, La Crescenta, CA (US); Michael F. Turk, Los Angeles, CA (US)

(73) Assignee: Suncore Photovoltaics, Inc., Albuquerque, NM (US)

( * ) Notice: Subject to any disclaimer, the term of this patent is extended or adjusted under 35 U.S.C. 154(b) by 555 days.

(21) Appl. No.: 13/271,331

(22) Filed: Oct. 12, 2011

(65) Prior Publication Data
US 2012/0085390 A1    Apr. 12, 2012

Related U.S. Application Data

(60) Provisional application No. 61/392,073, filed on Oct. 12, 2010.

(51) Int. Cl.
| | | |
|---|---|---|
| *H01L 31/042* | (2014.01) | |
| *F24J 2/52* | (2006.01) | |
| *H01L 31/02* | (2006.01) | |

(52) U.S. Cl.
CPC .......... *H01L 31/0422* (2013.01); *F24J 2/5205* (2013.01); *H01L 31/02* (2013.01); *F24J 2002/5277* (2013.01); *F24J 2002/5281* (2013.01); *Y02B 10/12* (2013.01); *Y02B 10/20* (2013.01); *Y02E 10/52* (2013.01); *Y02E 10/47* (2013.01)
USPC ........................................... 136/246; 136/244

(58) Field of Classification Search
CPC  F24J 2/5205; H01L 31/0422; H01L 31/0424; H01L 31/045
USPC .................................. 136/243–265
See application file for complete search history.

(56) References Cited

U.S. PATENT DOCUMENTS

| | | | |
|---|---|---|---|
| 3,690,080 A * | 9/1972 | Dillard ........................... 52/108 |
| 2006/0283497 A1 | 12/2006 | Hines | |
| 2008/0000515 A1* | 1/2008 | Lin et al. ....................... 136/246 |
| 2010/0018570 A1 | 1/2010 | Cashion et al. | |
| 2012/0085390 A1* | 4/2012 | Johnson et al. ............... 136/246 |

* cited by examiner

*Primary Examiner* — Bach Dinh
*Assistant Examiner* — Niki Bakhtiari
(74) *Attorney, Agent, or Firm* — Mueting, Raasch & Gebhardt, P.A.

(57) ABSTRACT

The present invention relates to an adjustable racking system for transporting and mounting one or more solar panels to, for example, a rooftop.

14 Claims, 8 Drawing Sheets

INTEGRATED SHIPPING AND INSTALLATION RACKING

PRIORITY

The present nonprovisional patent application claims priority under 35 U.S.C. §119(e) from U.S. Provisional patent application having Ser. No. 61/392,073, filed on Oct. 12, 2010, by Johnson, Jr. et al. and titled INTEGRATED SHIPPING AND INSTALLATION RACKING, wherein the entirety of said provisional patent application is incorporated herein by reference.

STATEMENT REGARDING FEDERALLY SPONSORED RESEARCH OR DEVELOPMENT

The present invention was made with Government support under Cooperative Agreement No. DE-FC36-07G017044 awarded by the U.S. Department of Energy. The Government has certain rights in this invention.

FIELD OF THE INVENTION

The present invention relates to the shipping and installation of photovoltaic power systems, photovoltaic concentrator modules, and related devices and methods. In certain embodiments, the present invention relates to photovoltaic systems made of panels that are larger or bulkier (e.g., panels including photovoltaic concentrator modules) than traditional flat plate solar panels.

BACKGROUND OF THE INVENTION

Solar panels are generally well known (see, e.g., U.S. Pub. No. 2006/0283497 (Hines) and U.S. Pub. No. 2010/0018570 (Cashion et al.)). Installing a system of solar panels on a rooftop can present a number of logistical challenges.

One challenge is to create a structure that will hold the panels in place on the rooftop given wind, seismic and roof weight capacity requirements. Many systems are presently available in the market and there are many years of industry experience, specifically with traditional flat plate solar panels. Traditional rooftop mounting structures are typically shipped to the job site in pieces and generally installed on the roof before solar panels arrive. FIG. 1 shows an installation of concentrating photovoltaic (CPV) panels with such traditional racking practices. As shown, three panels 10, 20, and 30 are mounted on a roof 50. Each of the panels 10, 20, and 30 includes six concentrating photovoltaic modules 15. Also, the panels 10, 20, and 30 are mounted to the roof 50 using racking system 40.

Racking system 40 includes two mounting rails 41 positioned on round cross rails 43. The round cross rails are supported above the surface of roof 50 via posts 42. Each of the panels 10, 20, and 30 are coupled to rails 41.

Another challenge can be to merely get the product and balance of system from the factory to the rooftop in an efficient manner. One traditional approach with flat panels is to palletize the solar panels in a box roughly 48" cube and fill a container and take it to the job site to be craned to the roof. Another method used by some, to save on expensive rooftop labor, is to build an array of multiple solar panels into one large framework. These are then delivered to a jobsite on an open flatbed truck and craned directly to the roof as shown in FIG. 2. As shown, a group 60 having six panel arrays 61 can be lifted to a roof via crane 64. Each array 61 includes four traditional flat solar panels 62. Panels 62 are held together in each respective array 61 via steel beams 63 that run lengthwise on an outer edge of the panels 62. The steel beams 63 become part of the racking system (not shown).

Concentrating photovoltaic (CPV) panels are generally bigger and bulkier than flat plate solar panels. This is because they typically require some distance in order to focus the light onto solar cells. This can be a bigger logistical challenge to ship product to jobsites. More specifically, flat plate solar panels can be stacked on each other in a compact manner while CPV panels generally cannot. This is true because CPV panels typically track the sun in two axes and generally have a shape somewhat complicated and non-conducive to stacking.

One approach is to create a box or packaging that can be used to ship product in a container 70, as shown in FIG. 3. As shown, container 70 is partially filled with concentrating photovoltaic panels 71 that are mounted in four racking systems 73 that are designed to be reusable for transporting panels 71. Each concentrating photovoltaic panel 71 includes six concentrating photovoltaic modules 77 connected to one tracker 78. However, a panel could include seven, eight, or any number of modules 77. The racking system 73 is wide enough to contain two panels 71 and has a height to accommodate two panels 71 stacked on two additional panels (as shown it the middle racking system 73). The racking system towards the front has room to accommodate two additional modules 77 that could be stacked on the bottom two modules 77 (as shown in the middle racking system 73). Racking systems similar to racking system 73 can be wider, e.g., having a width to accommodate three panels 71, which is typical for domestic trailers or flatbed trucks (not shown). Each racking system 73 includes four corner posts 75 and each post 75 has a pointed/rounded top 74 that can mate with the bottom 76 of another post 75 such that racking system 73 can have another racking system 73 be stacked thereon (e.g., as shown in the rear of container 70). Similarly, racking system 73 could be stacked on top of another racking system 73 via the mating portions of posts 75. Posts 75 also include loops 79 that can be used by a crane to lift racking system 73 to a roof (not shown).

This packaging (racking system 73 plus panels 71) can also be craned to the rooftop where the panels 71 are removed from the packaging. The packaging is not used to install the panels to the rooftop. Such a package can be inherently expensive to make so the packaging is typically returned and reused. Being returnable can create a logistic and freight cost issue to stack these at a jobsite and return them. The packaging can be made collapsible to mitigate some of the freight cost. However, it can also create a significant amount of capital investment in the returnable packaging because enough of these are typically made to ensure all jobsites can have them and that the factory never runs out. This could be a supply equal to months of manufacturing capacity.

SUMMARY OF THE INVENTION

The present invention is an adjustable racking system that forms part of (is integrated with) the permanent framing of one or more solar panels.

Advantageously, the racking system is built remotely from an installation site and can be used to transport and mount solar panels to, for example, a rooftop.

According to one aspect of the present invention, a solar panel racking system includes at least one solar panel (preferably panels of photovoltaic concentrator modules) comprising a plurality of photovoltaic concentrator modules and a racking structure attached to the at least one solar panel such that the racking structure can help provide structural integrity of the solar panel during transportation. The racking structure can attach to a mounting structure during installation of the at least one solar panel.

The present invention also relates to methods of transporting and installing solar panel racking systems.

DETAILED DESCRIPTION

The present invention is a shipping rack that converts to the installation racking for mounting on a surface such as a rooftop. Preferably, a racking system according to the present invention is shipped in a compact form and then the racking structure is expanded to a desired installed condition.

Figure 1:
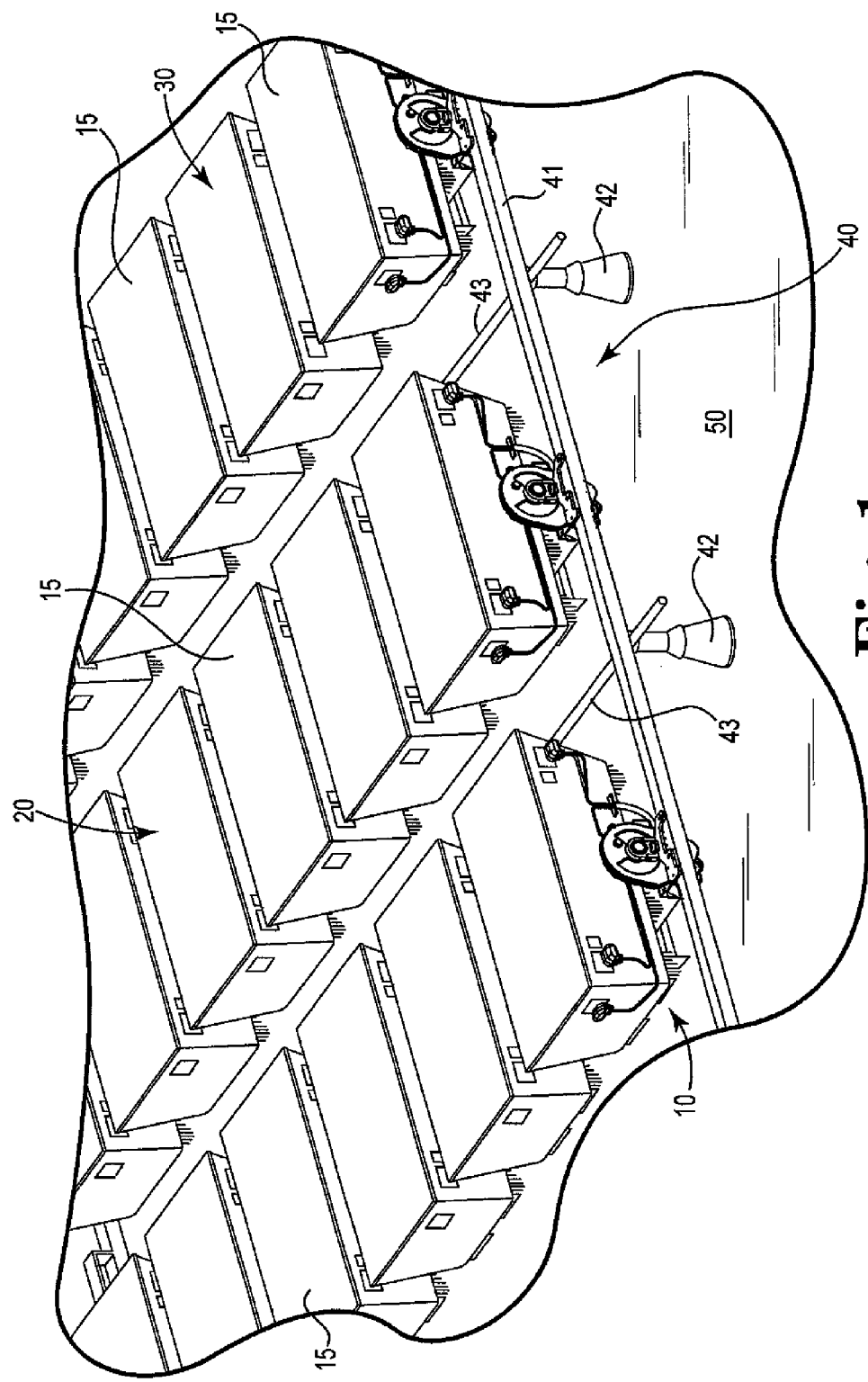
FIG. 1 shows a perspective view of concentrating photovoltaic panels mounted on a roof with conventional racking.
Figure 2:
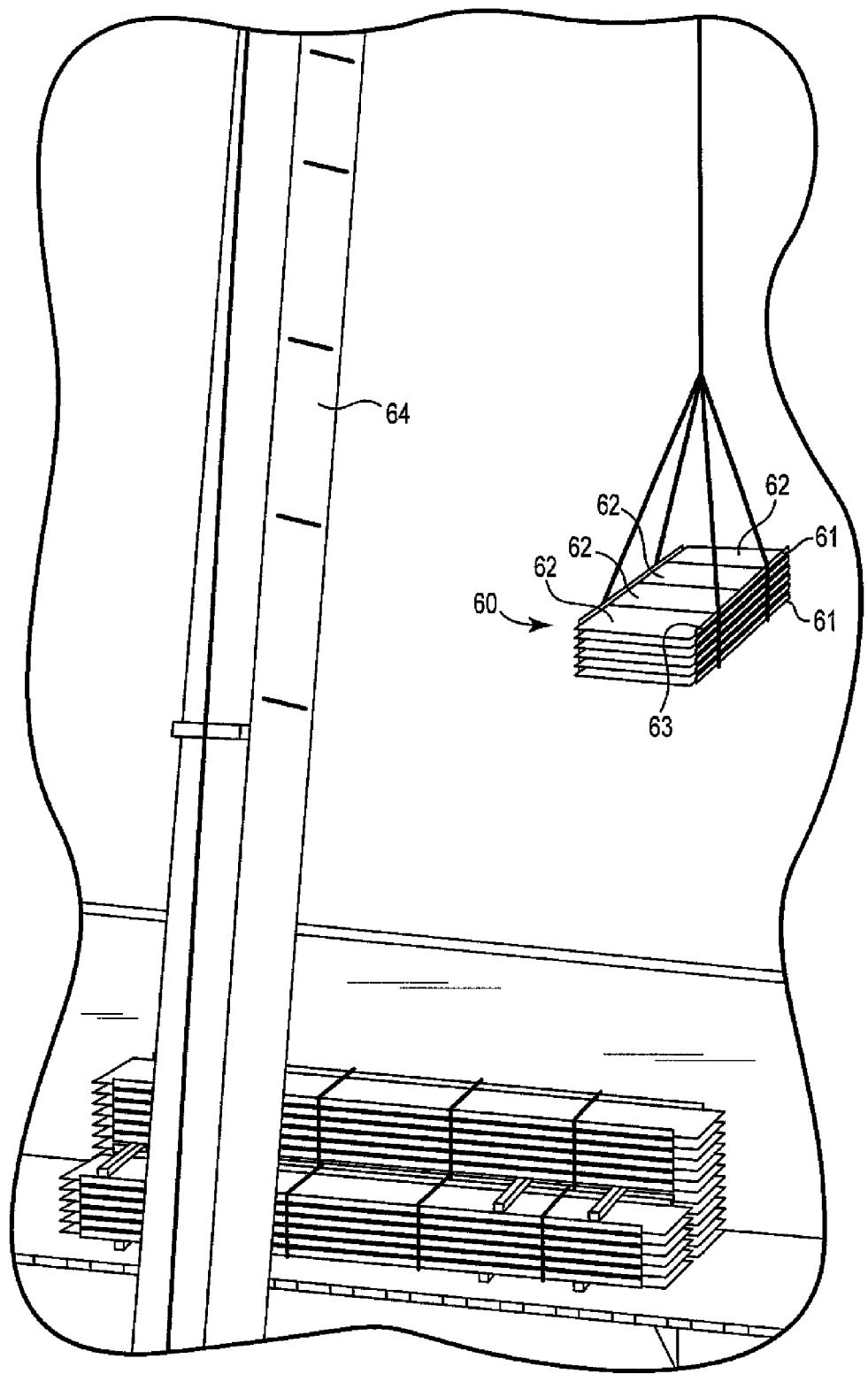
FIG. 2 shows a perspective view of arrays of flat panels being lifted by a crane onto a roof.
Figure 3:
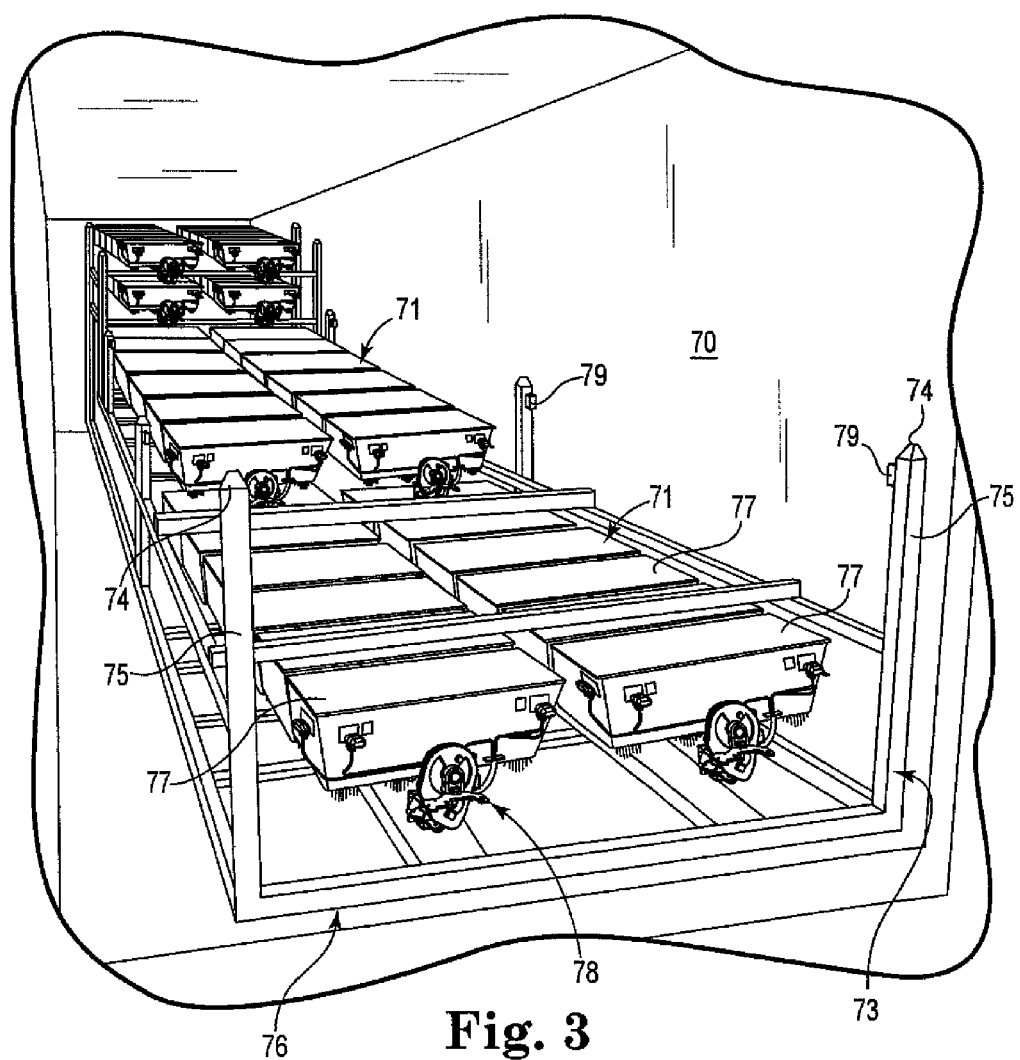
FIG. 3 shows a perspective view of multiple concentrating photovoltaic panels positioned in a container for transporting the panels.
Figure 4:
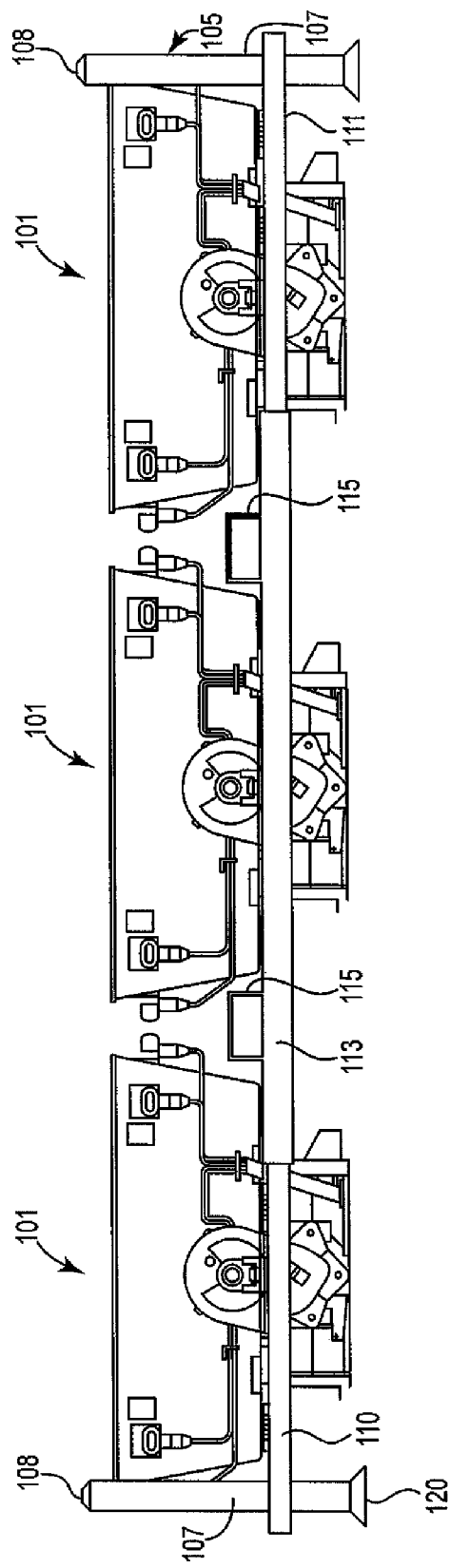
FIG. 4 is an elevation view of a racking system according to the present invention.
Figure 5:
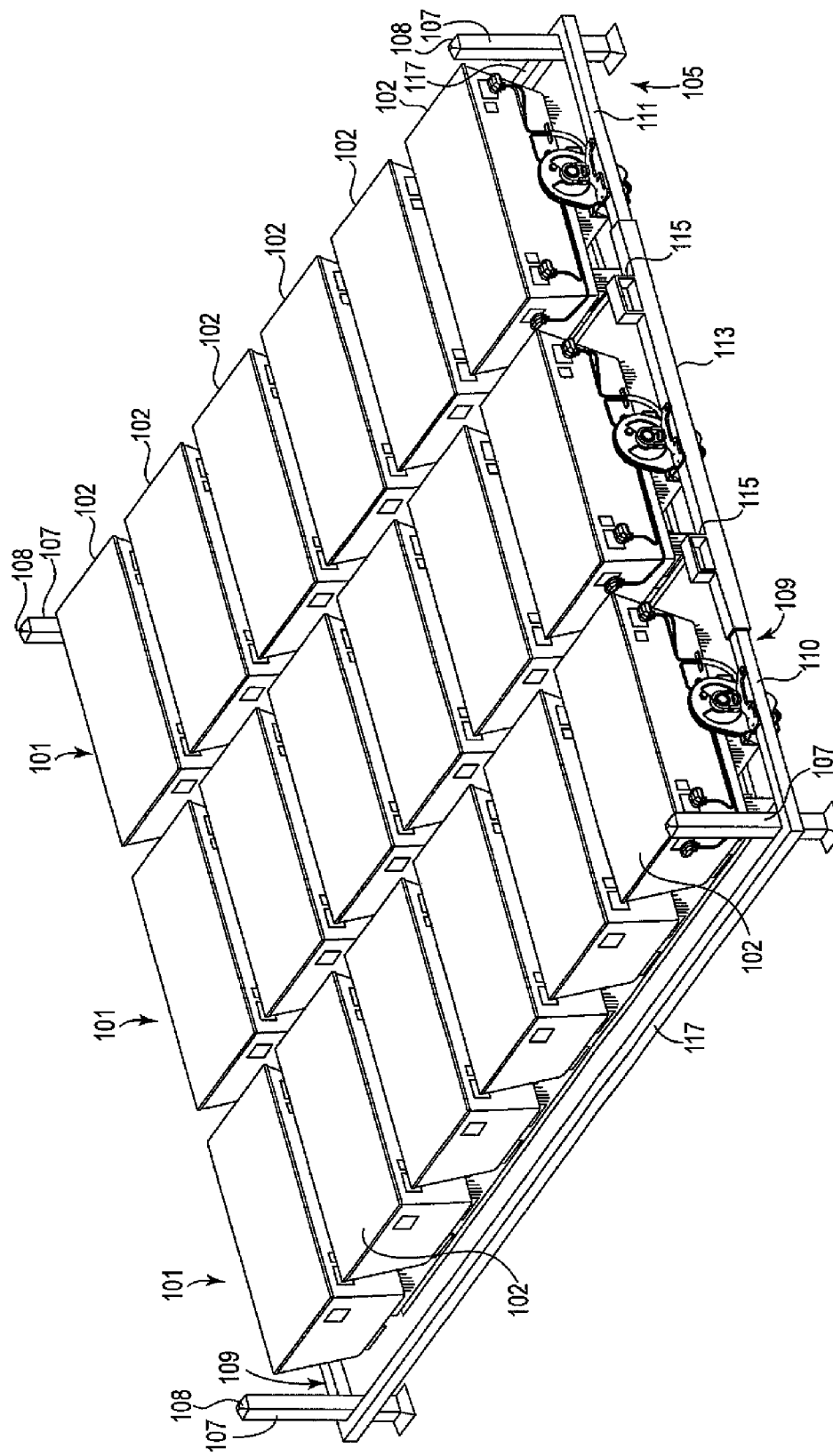
FIG. 5 is a perspective view of the racking system shown in FIG. 4.

For example FIG. 4 and FIG. 5 show a preferred embodiment according the present invention. In this embodiment, a group of three CPV panels 101 are mounted to a metal frame 105 and positioned relatively close together for shipping purposes. As shown in FIG. 5, each panel 101 includes six photovoltaic concentrator modules 102.

Frame 105 can be a single frame member or composed of multiple individual frame members attached to each other to form a frame. As shown, racking structure 105 includes two frame members 117, two frame members 109, and four posts 107.

Figure 8:
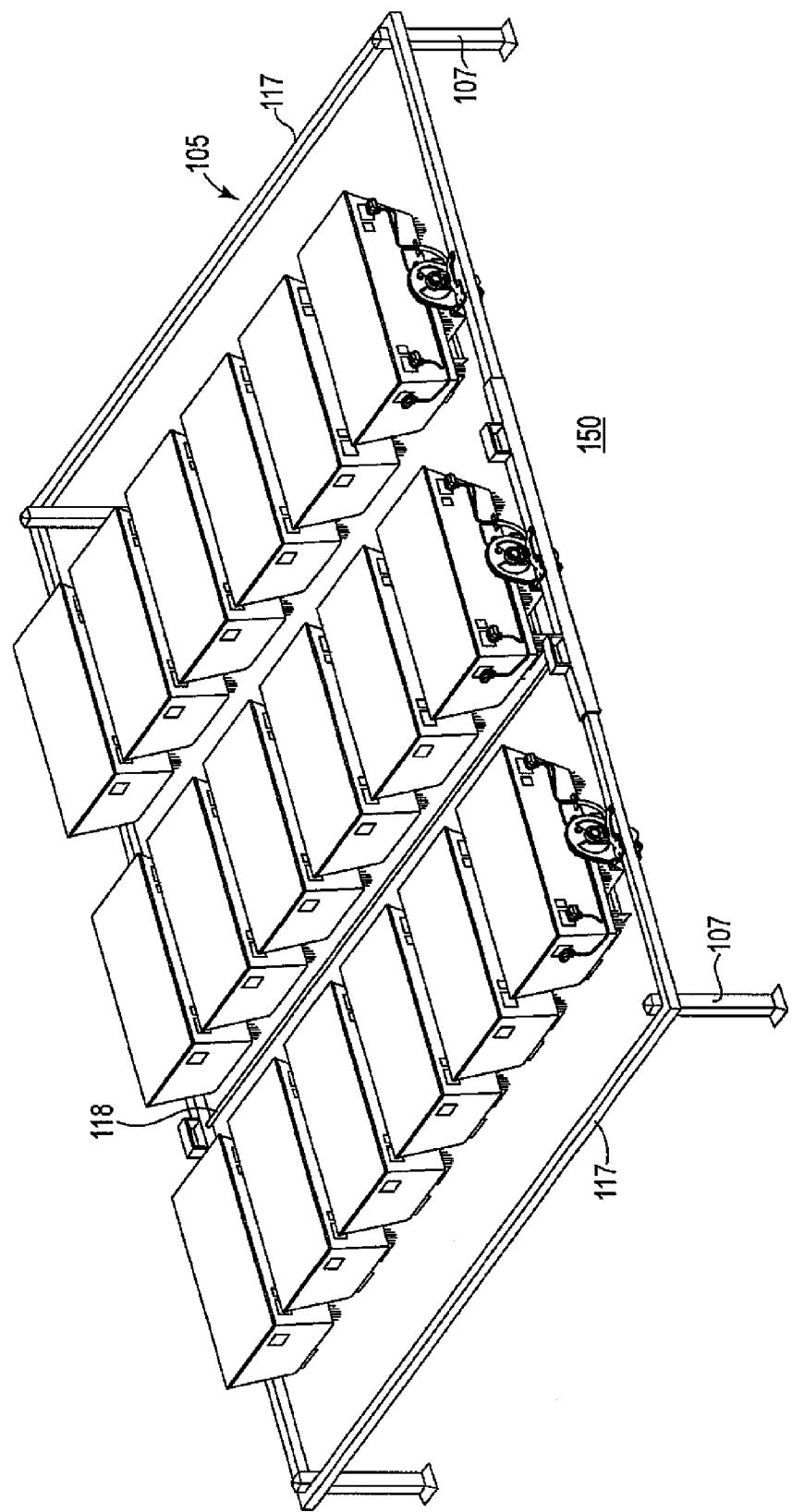
FIG. 8 shows a perspective view of the racking systems shown in FIG. 7.

As shown in FIG. 5, each frame member 117 is connected to each frame member 109 and two posts 107 via any suitable fastening technique such as welding, clamping, and the like. As shown in FIG. 8, frame 105 can optionally include additional beams such as beam 118 for additional support. Such beams can include posts/legs (not shown) as needed for support.

Each frame member 109 has a portion 110 and a portion 111 that can slidingly engage tube member 113 so as to telescope in and out within tube member 113 as described below.

Figure 6:
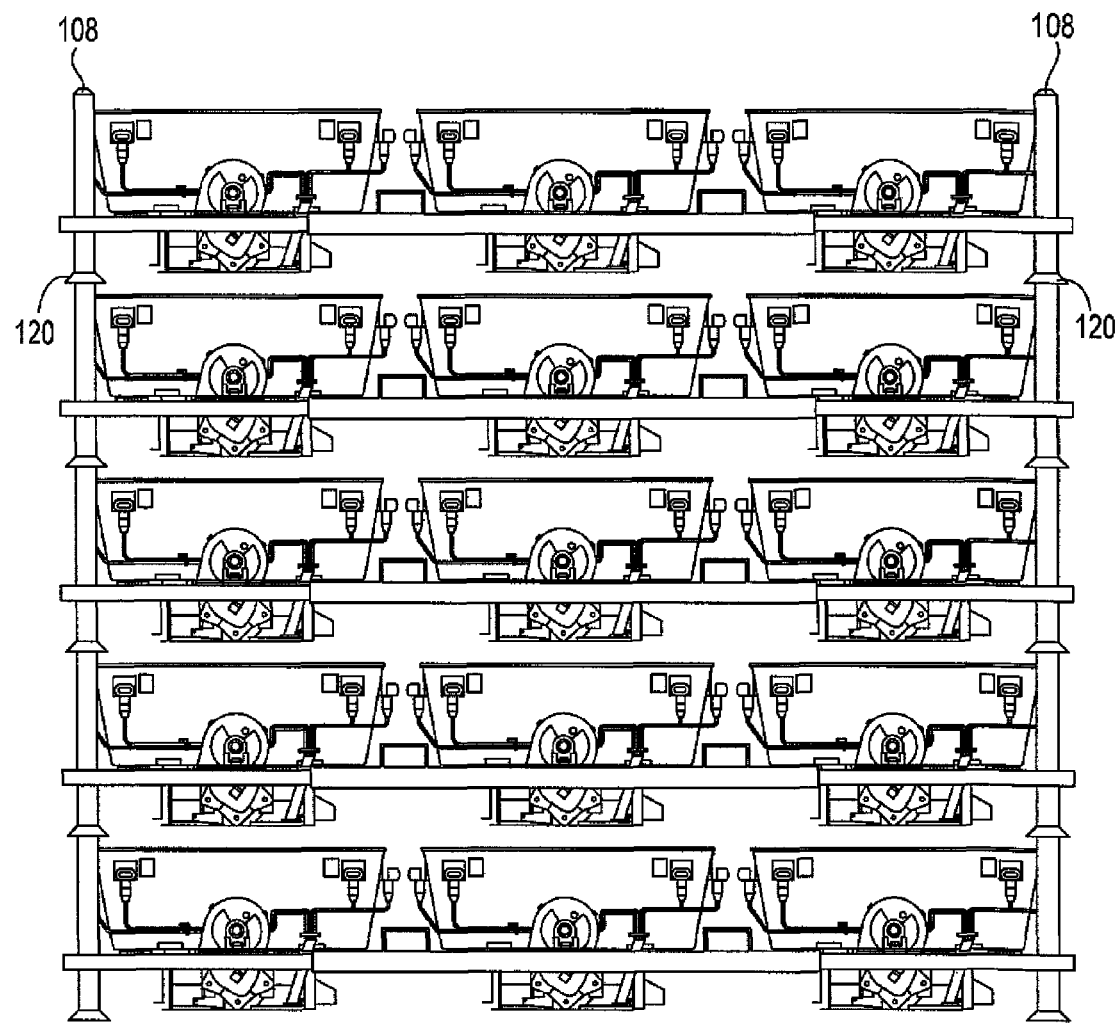
FIG. 6 is an elevation view of multiple racking systems according to FIG. 4 arranged in a stacked manner.
Figure 7:
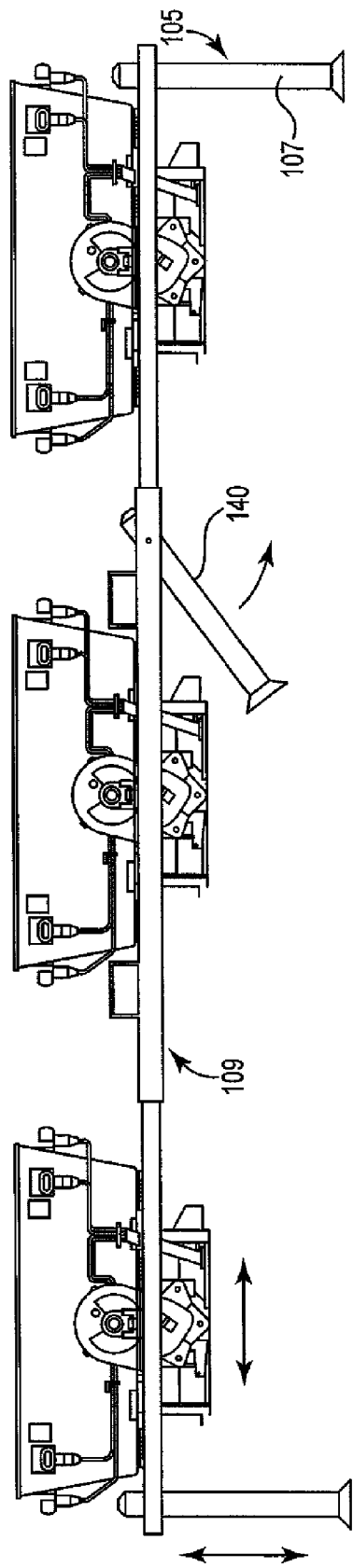
FIG. 7 shows an elevation view of the racking system shown in FIG. 4 in an installed position.

While suspended by a crane or when placed on the ground, the frame of the racking structure 105 can be transformed as necessary from the shipping position shown in FIGS. 4, 5, and 6 to a preferred installation position as shown in FIG. 7 and FIG. 8. The frame members 110 and 111 can telescope inside of tube member 113 and/or possibly fold out like a lawn chair (not shown) until the panels 101 are spaced to the desired distance from each other. As shown in FIG. 7, posts 107 can slidingly adjust up or down relative to frame member 109 as desired.

Leg(s) 140 can rest on the roof 150 and are preferably designed to slide to any location, for example, so as to land on a roof beam or avoid roof top obstacles etc. Leg(s) 140 can slide, fold, or pivot into position and can contain some type of easy to use locking feature or nut and bolt set-up. Optionally, additional support legs (not shown) can be included along frame members 117.

This racking structure 105 is designed such that it can be stacked on top of other racking systems similar to racking system 105 and/or be stacked upon by other racking systems similar to racking system 105 as shown in FIG. 6. Racking systems 105 can be stacked as high as allowed to fill a truck or container (not shown) or stacking for storage within a warehouse (not shown).

To help provide the ability to stack in such a manner, posts 107 include rounded ends 108 that can mate with corresponding bottom portions 120 of another racking system 105. Preferably, bottom portions 120 have a widened base to provide stability when installed on a surface such as a rooftop.

This racking structure 105 is also designed to be lifted by crane (not shown) to the rooftop. An example of the crane lifting features 115 are shown in FIG. 5.

In addition various features can be added to the rack 105 to help support the load during shipment. These could be foam pieces to stop vibrations, features that accept plastic or metal bands to secure the load, etc.

Also, the racking structure 105 can include additional structure at various points along its perimeter to permit racking system 105 to be attached to adjacent racking systems (not shown).

Racking system 105 can be made out of any material suitable for supporting and securing panels 101 to rooftop 150. Exemplary materials are well known and include extruded aluminum, galvanized steel, u-channel and the like.

Racking systems 105 can be made using well-known techniques such as welding, molding, clamping, and the like.

What is claimed is:

1. A solar panel system comprising:
   at least one solar panel comprising a plurality of photovoltaic concentrator modules, wherein each of the least one solar panel extends between a first plane configured to receive incident sunlight and a second plane opposite the first plane; and
   a racking structure configured to support the at least one solar panel above a ground surface during transportation and after installation of the solar panel system, wherein the racking structure is attachable to a mounting structure during installation to support the at least one solar panel above a ground surface, wherein the racking structure is configurable in a shipping position and an installation position and comprises:
   a frame attached to the at least one solar panel, wherein the frame comprises a plurality of longitudinal members attached to each other and extending along a frame plane, and
   a plurality of posts coupled to the frame, wherein each of the plurality of posts extends from a first end portion to a second end portion along a post axis perpendicular to the frame plane, wherein each of the plurality of posts is coupled to the frame between the first end portion and the second end portion to support the frame and the at least one solar panel above a ground surface when the racking structure is in the shipping position and the installation position,
   wherein the first end portion of each of the plurality of posts extends beyond the first plane of the at least one solar panel when the racking structure is in the shipping position, wherein the second end portion of each of the plurality of posts extends beyond the second plane of the at least one solar panel when the racking structure is in the shipping position, wherein all of the first plane of the at least one solar panel is locatable beyond the first end portion of each of the plurality of posts when the racking structure is in the installation position, wherein the second end portion of each of the plurality of posts extends beyond the second plane of the at least one solar panel when the racking structure is in the installation position.

2. The solar panel system of claim 1,
wherein the plurality of longitudinal members comprises four longitudinal members defining a perimeter about the at least one solar panel,
wherein the plurality of posts comprises at least four posts configured to be attached to the mounting structure during installation of the at least one solar panel.

3. The solar panel system of claim 1, wherein each of the at least one solar panel comprises six photovoltaic concentrator modules.

4. The solar panel system of claim 3, wherein each of the six photovoltaic concentrator modules comprises:
a housing comprising a base and at least one solar cell mounted to the base; and
a plurality of lenses attached the housing and spaced apart from the solar cells such that each lens focuses incident light onto a corresponding solar cell, wherein the plurality of lenses lie within the first plane of the at least one solar panel.

5. The solar panel system of claim 1, wherein the racking structure is configured to permit one or more additional like solar panel systems to be stacked upon the racking structure in a manner that maintains structural integrity of the at least one solar panel, and wherein the racking structure is configured to be stacked upon one or more additional like solar panel systems.

6. The solar panel system of claim 1, wherein each post of the plurality of posts is movably coupled to the frame to selectively move along the post axis, wherein the frame is located closer to the first end portion of each of the plurality of posts when the racking structure is in the installation position than when the racking structure is in the shipping position.

7. The solar panel system of claim 6, wherein, when the racking structure is in the installation position, each of the plurality of posts is moved to a position such that the first end portion of each post of the plurality of posts does not extend beyond the first plane of the at least one solar panel.

8. The solar panel system of claim 1, wherein the frame is selectively adjustable in at least one direction along the frame plane to adjust the distance between two or more adjacent solar panels of the at least one solar panel.

9. The solar panel system of claim 1, wherein each first end portion of the plurality of posts is configured to mate with each second end portion of a plurality of posts of another like solar panel system such that the another like solar panel system can be stacked on the solar panel system via the plurality of posts.

10. The solar panel system of claim 1, wherein each second end portion of the plurality of posts is attachable to the mounting structure on a rooftop.

11. A method of transporting two or more solar panel systems comprising:
providing a first and a second solar panel system, each of the solar panel systems according to claim 1;
stacking the first solar panel system on top of the second solar panel system via the racking structure of each of the first and the second solar panel systems; and
transporting the first and the second solar panel systems to an installation location.

12. A method of installing a photovoltaic power system comprising:
providing a first and a second solar panel system, each of the solar panel systems according to claim 1;
stacking the first solar panel system on top of the second solar panel system via the racking structure of each of the first and the second solar panel systems;
transporting the first and the second solar panel systems to an installation location;
lifting the first and the second solar panel systems onto a rooftop; and
mounting the first and the second solar panel systems to the rooftop via the racking structure of each of the first and the second solar panel systems.

13. The solar panel system of claim 1, wherein the racking structure is further configurable in a compact form and an expanded form, wherein at least two solar panels of the at least one solar panel are located further away from each other when in the racking structure is in the expanded form than when the racking structure is in the compact form.

14. The solar panel system of claim 8, wherein each of at least two longitudinal members of the plurality of longitudinal members of the frame comprises:
a tube member defining an opening extending therethrough; and
a frame member slideably engaging the tube member to telescope in and out within the tube member to selectively adjust the frame in at least one direction along the frame plane.

* * * * *

UNITED STATES PATENT AND TRADEMARK OFFICE
CERTIFICATE OF CORRECTION

| | | |
|---|---|---|
| PATENT NO. | : 8,981,204 B2 | Page 1 of 1 |
| APPLICATION NO. | : 13/271331 | |
| DATED | : March 17, 2015 | |
| INVENTOR(S) | : Richard L. Johnson, Jr., Richard J. Russell and Michael F. Turk | |

It is certified that error appears in the above-identified patent and that said Letters Patent is hereby corrected as shown below:

In the claims

In column 4, claim 1, line 38, please insert --at-- before "least one".

In column 6, claim 13, line 38, please delete the first occurrence of "in".

Signed and Sealed this
Fifteenth Day of December, 2015

Michelle K. Lee
*Director of the United States Patent and Trademark Office*